(12) United States Patent
Tanaka et al.

(10) Patent No.: US 11,298,796 B2
(45) Date of Patent: Apr. 12, 2022

(54) METHOD FOR DOUBLE-SIDE POLISHING WAFER

(71) Applicant: SHIN-ETSU HANDOTAI CO., LTD., Tokyo (JP)

(72) Inventors: Yuki Tanaka, Nishigo-mura (JP); Daichi Kitazume, Nishigo-mura (JP); Syuichi Kobayashi, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 420 days.

(21) Appl. No.: 15/779,141

(22) PCT Filed: Nov. 22, 2016

(86) PCT No.: PCT/JP2016/004942
§ 371 (c)(1),
(2) Date: May 25, 2018

(87) PCT Pub. No.: WO2017/098691
PCT Pub. Date: Jun. 15, 2017

(65) Prior Publication Data
US 2018/0272497 A1    Sep. 27, 2018

(30) Foreign Application Priority Data

Dec. 11, 2015    (JP) .............................. JP2015-241964

(51) Int. Cl.
*B24B 37/28* (2012.01)
*B24B 37/04* (2012.01)
(Continued)

(52) U.S. Cl.
CPC ............ *B24B 37/28* (2013.01); *B24B 37/042* (2013.01); *B24B 37/044* (2013.01);
(Continued)

(58) Field of Classification Search
CPC ......... B24B 37/28; B24B 37/042; B24B 7/17; B24B 37/044; B24B 37/08; B24B 27/0076; H01L 21/304
(Continued)

(56) References Cited

U.S. PATENT DOCUMENTS 5,882,245 A * 3/1999 Popovich ................ B24B 37/28
451/41
6,595,831 B1 * 7/2003 Hirokawa ................ B08B 1/04
451/36

(Continued)

FOREIGN PATENT DOCUMENTS

JP    2007-021680 A    2/2007
JP    2010-221362 A    10/2010
(Continued)

OTHER PUBLICATIONS

May 7, 2020 Office Action issued in Chinese Patent Application No. 201680069349.8.
(Continued)

*Primary Examiner* — Tyrone V Hall, Jr.
*Assistant Examiner* — Makena S Markman
(74) *Attorney, Agent, or Firm* — Oliff PLC (57) ABSTRACT

A method for double-side polishing a wafer uses a double-side polishing machine wherein a carrier which is yet to be arranged in the double-side polishing machine is previously subjected to two-stage double-side polishing which uses a double-side polishing machine different from the double-side polishing machine adopted for double-side polishing the wafer and includes primary polishing using slurry containing abrasive grains and secondary polishing using an inorganic alkali solution containing no abrasive grain, the carrier subjected to the two-stage double-side polishing is arranged in the double-side polishing machine adopted for
(Continued)

double-side polishing the wafer, and the double-side polishing of the wafer is performed. Consequently, the method for double-side polishing a wafer enables suppressing damages to wafers to be polished immediately after arranging the carrier between the upper and lower turntables.

16 Claims, 5 Drawing Sheets

(51) Int. Cl.
    *H01L 21/02*     (2006.01)
    *B24B 37/08*     (2012.01)
    *B24B 27/00*     (2006.01)

(52) U.S. Cl.
    CPC .......... *B24B 27/0076* (2013.01); *B24B 37/08* (2013.01); *H01L 21/02024* (2013.01)

(58) Field of Classification Search
    USPC .............................. 451/72, 41, 262, 268, 269
    See application file for complete search history.

(56) References Cited

U.S. PATENT DOCUMENTS

| | | | | |
|---|---|---|---|---|
| 7,589,023 | B2* | 9/2009 | Taniguchi | B24B 37/042 438/691 |
| 8,414,360 | B2* | 4/2013 | Lee | B24B 37/28 451/262 |
| 9,764,443 | B2* | 9/2017 | Sato | B24B 7/228 |
| 11,065,735 | B2* | 7/2021 | Kitazume | B24B 37/08 |
| 2006/0178089 | A1* | 8/2006 | Ueno | B24B 37/28 451/41 |
| 2007/0184662 | A1* | 8/2007 | Yamashita | B24B 37/28 438/692 |
| 2009/0057840 | A1* | 3/2009 | Netsu | H01L 21/02024 257/618 |
| 2009/0124175 | A1 | 5/2009 | Ueno et al. | |
| 2009/0139077 | A1* | 6/2009 | Lee | B24B 37/28 29/527.2 |
| 2011/0045748 | A1* | 2/2011 | Lee | B24B 37/28 451/65 |
| 2012/0028546 | A1* | 2/2012 | Pietsch | B24B 37/28 451/36 |
| 2013/0017765 | A1* | 1/2013 | Coad | B24B 7/17 451/36 |
| 2015/0375363 | A1 | 12/2015 | Sato et al. | |
| 2017/0069502 | A1 | 3/2017 | Sato et al. | |

FOREIGN PATENT DOCUMENTS

| | | |
|---|---|---|
| JP | 2014-176954 A | 9/2014 |
| JP | 2015-174168 A | 10/2015 |

OTHER PUBLICATIONS

Sep. 5, 2019 Office Action issued in Chinese Patent Application No. 201680069349.8.

Feb. 28, 2017 Search Report issued in International Search Report Application No. PCT/JP2016/004942.

* cited by examiner

METHOD FOR DOUBLE-SIDE POLISHING WAFER

TECHNICAL FIELD

The present invention relates to a method for double-side polishing a wafer by which a carrier is arranged between upper and lower turntables having polishing pads attached thereto in a double-side polishing machine, and the wafer is held in a holding hole formed in the carrier, sandwiched between the upper and lower turntables, and subjected to double-side polishing.

BACKGROUND ART

At the time of simultaneously polishing both sides of a wafer, the wafer is held by a carrier for a double-side polishing machine. This carrier is formed with a thickness smaller than that of the wafer, and includes a holding hole configured to hold the wafer at a predetermined position between an upper turntable and a lower turntable of the double-side polishing machine. The wafer is inserted and held in this holding hole, upper and lower surfaces of the wafer are sandwiched by polishing tools such as polishing pads provided on respective opposed surfaces of the upper turntable and the lower turntable, and polishing is performed while suppling a polishing agent to the surfaces to be polished (Patent Literature 1).

CITATION LIST

Patent Literature

Patent Literature 1: Japanese Unexamined Patent Publication (Kokai) No. 2007-21680

DISCLOSURE OF INVENTION

Problem to be Solved by the Invention

Such a method for polishing double-side has been carried out, and the present inventors have discovered that damage is given to wafers subjected to double-side polishing in some situations. Thus, they have conducted the earnest examination about the damage, and have found out that polished wafers are damaged in several batches immediately after arranging the carrier between the upper and lower turntables.

In view of such a problem as described above, it is an object of the present invention to provide a method for double-side polishing a wafer by which wafers to be polished can be prevented from being damaged immediately after arranging a carrier between upper and lower turntables.

Means for Solving Problem

To achieve the object, the present invention provides a method for double-side polishing a wafer, comprising: arranging a carrier between upper and lower turntables having polishing pads attached thereto respectively in a double-side polishing machine; holding a wafer in a holding hole formed in the carrier to be sandwiched between the upper and lower turntables; and double-side polishing the wafer, wherein the carrier which is yet to be arranged in the double-side polishing machine is previously subjected to two-stage double-side polishing which uses a double-side polishing machine different from the double-side polishing machine adopted for double-side polishing the wafer and includes primary polishing using slurry containing abrasive grains and secondary polishing using an inorganic alkali solution containing no abrasive grain, the carrier subjected to the two-stage double-side polishing is arranged in the double-side polishing machine adopted for double-side polishing the wafer, and the double-side polishing of the wafer is performed.

According to such a method for polishing double-side, even if a natural oxide film is formed on surfaces of the carrier before being arranged in the double-side polishing machine or slurry residues or polishing residues adhere to the same, they can be removed by the two-stage double-side polishing before the arrangement. Thus, when the double-side polishing of each wafer is performed by using the carrier subjected to this two-stage double-side polishing, it is possible to avoid damage on the wafer, which is being polished, due to particles generated from them. The method is particularly effective for preventing the damage from being given to each wafer which is being polished immediately after the arrangement of the carrier.

Further, since the two-stage double-side polishing of the carrier and the double-side polishing of each wafer are separately performed by the different double-side polishing machines, there is no damage, which is caused due to the remaining of the particles generated from the two-stage double-side polishing of the carrier in the double-side polishing machine, to the wafer at the time of polishing the wafer.

At this time, it is possible that the two-stage double-side polishing of the carrier which is performed before the arrangement in the double-side polishing machine is carried out before first arrangement for the double-side polishing of the wafer.

With this configuration, even if a natural oxide film or the like has been already formed on surfaces of a new carrier delivered from a manufacturer, it is possible to suppress damage to a wafer to be polished due to such a film.

Furthermore, it is possible that the carrier used for the double-side polishing of the wafer is taken out from the double-side polishing machine and temporarily stored, and the two-stage double-side polishing of the carrier which is performed before the arrangement in the double-side polishing machine is performed before rearranging the carrier for the double-side polishing of a next wafer.

Although the carrier is temporarily taken out and stored for, e.g., maintenance of the double-side polishing machine, but the surfaces of this carrier used for the double-side polishing are particularly active, and the natural oxide film is apt to be formed during the storage. Additionally, the surfaces are contaminated due to adsorption of the slurry residues or the polishing residues in some situations. However, adopting such a configuration as described above enables suppressing damage to each wafer to be polished caused due to these factors.

Further, the carrier can be made of a metal.

The surfaces of the metallic carrier are particularly active and unstable, and the natural oxide film and the like are apt to be formed thereon. Thus, the present invention which can previously remove them before the double-side polishing is particularly effective.

Furthermore, the abrasive grains in the slurry used in the primary polishing of the carrier can have a diameter of 70 nm or more.

When such abrasive grains are used, the natural oxide film and the like formed on the carrier surfaces can be efficiently and more assuredly removed.

Moreover, polishing pads used in the two-stage double-side polishing of the carrier can be urethane foam pads having Shore A hardness of 80 or more.

When such a material is used as the polishing pads, the natural oxide film and the like formed on the carrier surfaces can be efficiently and more assuredly removed.

Additionally, a polishing stock removal in the primary polishing of the carrier can be set to 30 nm or more on each side.

When the polishing stock removal in the primary polishing is set in this manner, it is a polishing amount which is sufficient to remove the natural oxide film and the like formed on the carrier surfaces, and they can be more assuredly removed.

Further, a temperature of the inorganic alkali solution used in the secondary polishing of the carrier can be set to 30° C. or more.

With this configuration, in the secondary polishing, residues produced from the primary polishing can be efficiently removed, and they can be more assuredly prevented from remaining on the carrier surfaces.

Effect of the Invention

As described above, according to the present invention, the natural oxide film and the like formed on the carrier surfaces can be previously removed before the arrangement, the double-side polishing of each wafer can be performed with the use of the carrier, and hence it is possible to suppress damage to the wafer to be polished due to the natural oxide film and the like immediately after the arrangement of the carrier.

BEST MODE(S) FOR CARRYING OUT THE INVENTION

An embodiment of the present invention will now be described hereinafter with reference to the drawings, but the present invention is not restricted thereto.

Figure 3:
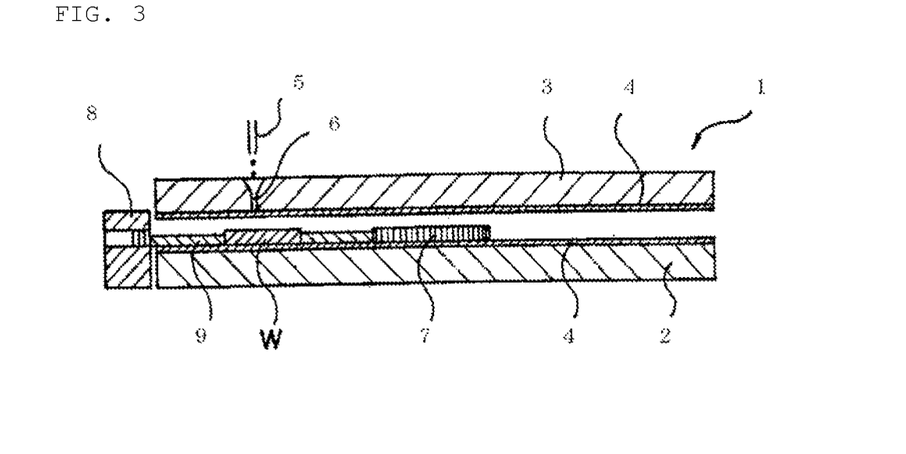
FIG. 3 is a longitudinal cross-sectional view showing an example of a double-side polishing machine.
Figure 4:
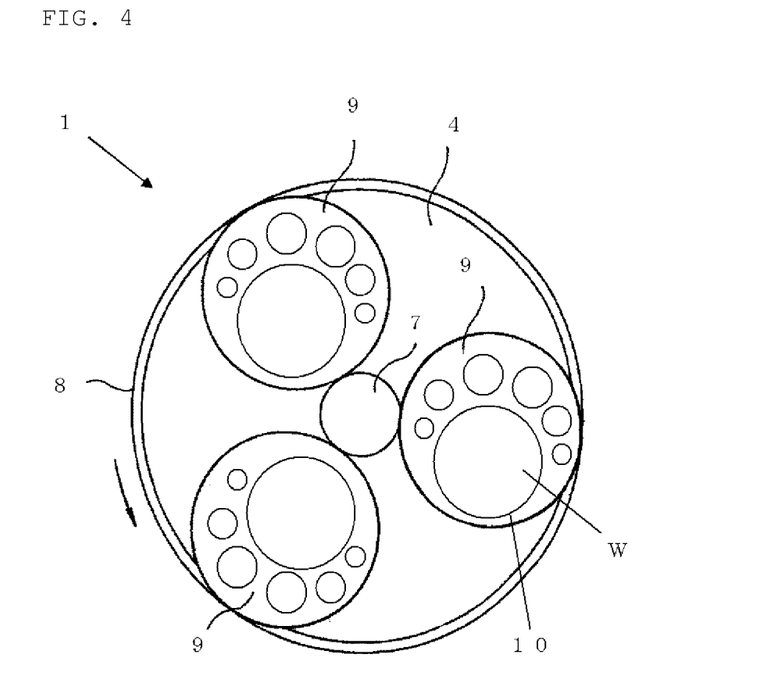
FIG. 4 is a plan view showing an example of the double-side polishing machine.

First, FIG. 3 shows an example of a longitudinal cross-sectional view of a double-side polishing machine which can be used in the method for double-side polishing according to the present invention. Further, FIG. 4 is a plan view of the double-side polishing machine. Although a planetary type will be described here, the present invention is not restricted thereto, and an oscillation type can be likewise used.

It is to be noted that the present invention requires different double-side polishing machines for wafer polishing and carrier polishing, but basic configurations of these machines may be the same or may be different. Any machines which can appropriately perform double-side polishing of wafers or carriers can suffice. A description will be given as to a case where the double-side polishing machines having the same basic configurations.

However, the carrier itself is used in common. That is, a carrier subjected to double-side polishing by a double-side polishing machine for carrier polishing is used for performing double-side polishing of wafers in a double-side polishing machine for wafer polishing.

A double-side polishing machine 1 (which is a double-side polishing machine A for wafer polishing or a double-side polishing machine B for carrier polishing) includes a lower turntable 2 and an upper turntable 3 which are provided to vertically face each other, and polishing pads 4 are attached to opposed surfaces of the turntables 2 and 3 respectively. Furthermore, a nozzle 5 through which slurry or the like is supplied is provided above the upper turntable 3, and a through hole 6 is provided in the upper turntable 3. Moreover, a sun gear 7 is provided at a central portion between the upper turntable 3 and the lower turntable 2, and an internal gear 8 is provided at a peripheral portion of the same. A wafer W held in a holding hole 10 formed in a carrier 9 (the wafer W is held in the holding hole 10 through a non-illustrated insert material) is sandwiched between the upper turntable 3 and the lower turntable 2.

It is to be noted that FIGS. 3 and 4 show a case where a polishing target is the wafer W. When the polishing target is the carrier 9, the wafer W is eliminated from FIGS. 3 and 4.

Outer peripheral teeth of the carrier 9 mesh with respective tooth portions of the sun gear 7 and the internal gear 8, and the carrier 9 revolves around the sun gear 7 while rotating with rotation of the upper turntable 3 and the lower turntable 2 performed by a non-illustrated driving source.

At this time, both sides of the carrier 9 are polished by the upper and lower polishing pads 4 at the same time.

Furthermore, when the wafer W is the polishing target, the wafer W is held in the holding hole 10 of the carrier 9, and both sides thereof are polished by the upper and lower polishing pads 4 at the same time.

It is to be noted that, at the time of each polishing, slurry for carrier polishing or slurry for wafer polishing is supplied from the nozzle 5 via the through hole 6. A temperature adjustor is also provided, and each slurry can be supplied at a desired temperature.

It is to be noted that a material of the carrier 9 is not restricted in particular, but the present invention is particularly effective when it is made of a metal. The surfaces of the metallic carrier are active and unstable, and a natural oxide film and the like which can cause damage to wafers to be polished are apt to be formed. The present invention can previously remove the natural oxide film and the like which are apt to be formed on the surfaces of the carrier before being arranged between the upper and lower turntables for wafer polishing.

Moreover, although the polishing pads 4 are not restricted in particular, it is possible to use, e.g., urethane foam pads having Shore A hardness of 80 or more in the double-side polishing machine B for carrier polishing. When such hardness is provided, in the method for double-side polishing according to the present invention, the natural oxide film and the like formed on the surfaces of the carrier 9 can be efficiently and more assuredly removed.

The method for double-side polishing a wafer according to the present invention using such double-side polishing machines as shown in FIGS. 3 and 4 will now be described.

The method for double-side polishing according to the present invention can be applied to, e.g., a case where a carrier is arranged in the double-side polishing machine for the first time in order to double-side polish a wafer. A situation where a new carrier delivered from a manufacturer is used for replacement of the carrier can be considered (Embodiment 1).

Additionally, the present invention can be also applied to a case where the carrier already used for the double-side polishing of wafers is taken out from the double-side polishing machine, temporarily stored, and again arranged in the double-side polishing machine to perform the double-side polishing of a next wafer. A case where the carrier temporarily removed from the double-side polishing machine for replacement, maintenance, and the like of a component such as the polishing pad other than the carrier is used can be considered (Embodiment 2).

It is to be noted that the present invention is not restricted thereto, and the present invention can be applied when the carrier is arranged in the double-side polishing machine to double-side polish each wafer.

(Embodiment 1: the carrier is arranged in the double-side polishing machine for the first time in order to double-side polish a wafer)

Embodiment 1 will be first described with reference to FIG. 1.

First, a new carrier is prepared for carrier replacement (Step B1). It is to be noted that the present invention is particularly effective for the carrier made of a metal, but a different material such as a resin can be also used. A natural oxide film is usually formed on a new carrier delivered from a manufacturer. Further, a case where other impurities adhere to the carrier can be also considered. When the carrier is used for the double-side polishing as it is in this state, the film or the impurities come off during the double-side polishing of wafers, and they can be a cause of damage on surfaces of each polished wafer.

Thus, the natural oxide film and the like on the carrier surfaces are removed in advance. Specifically, the new carrier is arranged in the double-side polishing machine B (Step B2), the upper and lower turntables and the respective gears are driven while supplying the slurry or the like from the nozzle, and the carrier is double-side polished by the polishing pads to remove the natural oxide film (Step B3).

Here, in this Step B3, the double-side polishing is performed on two stages (primary polishing and secondary polishing). It is to be noted that, as the polishing pads used in the double-side polishing machine B in this example, polishing pads having, e.g., Shore A hardness of 80 or more can be adopted as described above, and the natural oxide film can be thereby efficiently and more assuredly removed. As an upper limit of the hardness, for example, Shore A hardness of 95 is sufficient.

In the primary polishing, the slurry containing abrasive grains is used. Consequently, the natural oxide film or unnecessary impurities on the surfaces of the carrier can be removed. Although the abrasive grains to be used are not restricted in particular, abrasive grains each having a diameter of 70 nm or more can be used to efficiently remove the natural oxide film and the like. More preferably, abrasive grains each having a diameter of 100 nm or more can be used and, as an upper limit of the diameter, for example, approximately 200 nm can suffice. An appropriate material such as silica can be used each time in correspondence with a material of wafers.

Moreover, as to this slurry, concentration of the abrasive grains can be set to, e.g., 10 wt % or more and 20 wt % or less, and an inorganic alkali solution of pH 10 to 11 can be adopted.

Additionally, a polishing stock removal can be set to, e.g., 30 nm or more on each side. When the polishing is performed to this extent, the natural oxide film and the like can be assuredly removed. As an upper limit, for example, 100 nm can be set. A polishing amount falling within such a range is sufficient as a polishing amount for removal of the natural oxide film and the like. However, the present invention is not restricted to this polishing amount as a matter of course, and the polishing amount can be appropriately determined in accordance with a state of the natural oxide film and the like formed on the carrier.

Further, in the primary polishing, a machining load can be set to, e.g., 100 to 200 gf/cm$^2$.

Then, the secondary polishing using an inorganic alkali solution containing no abrasive grain is performed. As the inorganic alkali solution, for example, KOH-based solution having pH 10 to 11 can be used. Consequently, residues, abrasive grains, polishing chips, and the like which have attached to the surfaces of the carrier in the primary polishing can be removed. When the residues are dried/solidified, they are hard to be dissolved and cleaned, but performing the inorganic alkali cleaning by the secondary polishing in the double-side polishing machine B after the primary polishing enables efficiently removing them.

Furthermore, a temperature of the inorganic alkali solution is not restricted in particular, but it can be set to, e.g., 30° C. or more. Its upper limit can be set to, e.g., 40° C. When such a temperature range is adopted, the residues and the like produced in the primary polishing can be further efficiently removed. Therefore, it is possible to suppress damage to each wafer to be polished due to the residues remaining on the carrier at the time of using the carrier for the subsequent double-side polishing of wafers.

Moreover, a machining load can be set to, e.g., 50 to 100 gf/cm$^2$ in the secondary polishing.

The carrier subjected to the two-stage double-side polishing as described above is taken out from the double-side polishing machine B (Step B4).

Then, the carrier subjected to the two-stage double-side polishing is arranged in the double-side polishing machine A used for double-side polishing each wafer, which is different from the double-side polishing machine B (Step A1). The double-side polishing of each wafer is performed by using the double-side polishing machine A which is different from the double-side polishing machine B. If the same double-side polishing machine is used for both wafer polishing and carrier polishing, polishing chips and the like produced in the two-stage double-side polishing of the carrier remain in the double-side polishing machine and damage wafers. However, since the different double-side polishing machines are used in the present invention, such a problem can be prevented from occurring.

It is to be noted that it is good to perform Step A1 to effect the later-described double-side polishing within one hour after Step B4. Such a time limit is set to prevent the natural oxide film from again being formed on the surfaces of the carrier or suppress adherence of impurities on the same.

Then, a wafer is loaded in, i.e., the wafer is held in the holding hole of the carrier and sandwiched between the upper and lower turntables (Step A2), and the double-side polishing is carried out (Step A3). A procedure of this double-side polishing itself can be the same as a conventional procedure. That is, to polish the wafer, the upper and lower turntables and the respective gears are driven while supplying the appropriately slurry from the nozzle, and the double-side polishing with a desired polishing stock removal is carried out with the use of the polishing pads.

Further, the polished wafer is collected (Step A4). Step A2 to Step A4 are continuously repeated (N times) as required, and the wafers are polished and collected.

According to such a method for double-side polishing wafers of the present invention, before actually arranging the carrier in the double-side polishing machine A, the natural oxide film and the like on the surfaces of the carrier can be removed by the two-stage double-side polishing. Thus, it is possible to avoid occurrence of particles due to the natural oxide film and the like which are produced when the new carrier having the natural oxide film and the like is used as it is to polish the wafer in conventional examples. Therefore, damage such as scratches can be prevented from being formed on the surfaces of the polished wafer. This damage is particularly abundantly produced in several batches immediately after arranging the carrier, but it can be avoided, and high-quality polished wafers can be provided immediately after the arrangement.

(Embodiment 2: the carrier used for double-side polishing of wafers is taken out from the double-side polishing machine, temporarily stored, and again arranged to double-side polish a next wafer)

Embodiment 2 will now be described hereinafter with reference to FIG. 2.

For maintenance of a life of the polishing pads and others, the carrier used for the double-side polishing of wafers is taken out from the double-side polishing machine A (Step A5), the double-side polishing machine A is completely stopped (Step A6), and the maintenance of the double-side polishing machine A is performed (Step A7).

On the other hand, the carrier taken out from the double-side polishing machine A is subjected to, e.g., cleaning as required, and then temporarily stored for later reuse (Step B5). A storage method is not restricted in particular. It may be naturally dried and stored in a container, or may be stored in a tank filled with a predetermined solution. It may be appropriately stored by a method which can avoid formation of the natural oxide film or adherence of other impurities.

Furthermore, the two-stage double-side polishing is performed to the stored carrier by using the double-side polishing machine B in accordance with end timing of the maintenance of the double-side polishing machine A (Step B2 to Step B4). Step B2 to Step B4 can be carried out in the same procedure as that in Embodiment 1.

Moreover, the carrier subjected to the two-stage double-side polishing is again arranged in the double-side polishing machine A after the end of maintenance (e.g., arranged within one hour after the two-stage double-side polishing) (Step A1), and loading of a next wafer to be polished, polishing, and collection are repeatedly performed (Step A2 to Step A4). Step A2 to Step A4 can be carried out in the same procedure as that in Embodiment 1.

Additionally, in case of again performing the maintenance of the double-side polishing machine A, the carrier is taken out (Step A5), and such steps as described above can be again repeated.

The surfaces of the carrier once used for the polishing are particularly active, and the natural oxide film is apt to be formed thereon at the time of storage. Further, they are contaminated due to adsorption of slurry residues or polishing residues in wafer polishing in some cases. In the present invention, these adhering extraneous matters can be removed by performing the two-stage double-side polishing in the double-side polishing machine B before rearrangement in the double-side polishing machine A. Consequently, at the time of polishing wafers, particles can be prevented from occurring from them, and damage to the wafers can be avoided. In particular, the present invention is really effective in several batches immediately after again arranging the carrier.

It is to be noted that, in Embodiments 1 and 2, the example of new carrier and the example of the used carrier have been separately described, but they can be combined as a matter of course. That is, for example, like Embodiment 1, the new carrier is subjected to the two-stage double-side polishing and arranged in the double-side polishing machine A to perform double-side polishing for wafers. Then, like Embodiment 2, this used carrier can be subjected to the two-stage double-side polishing for maintenance of the double-side polishing machine A and again arranged in the double-side polishing machine A to perform double-side polishing for wafers.

EXAMPLES

Although the present invention will now be more specifically described hereinafter with reference to an example and a comparative example, the present invention is not restricted thereto.

Example

Figure 2:
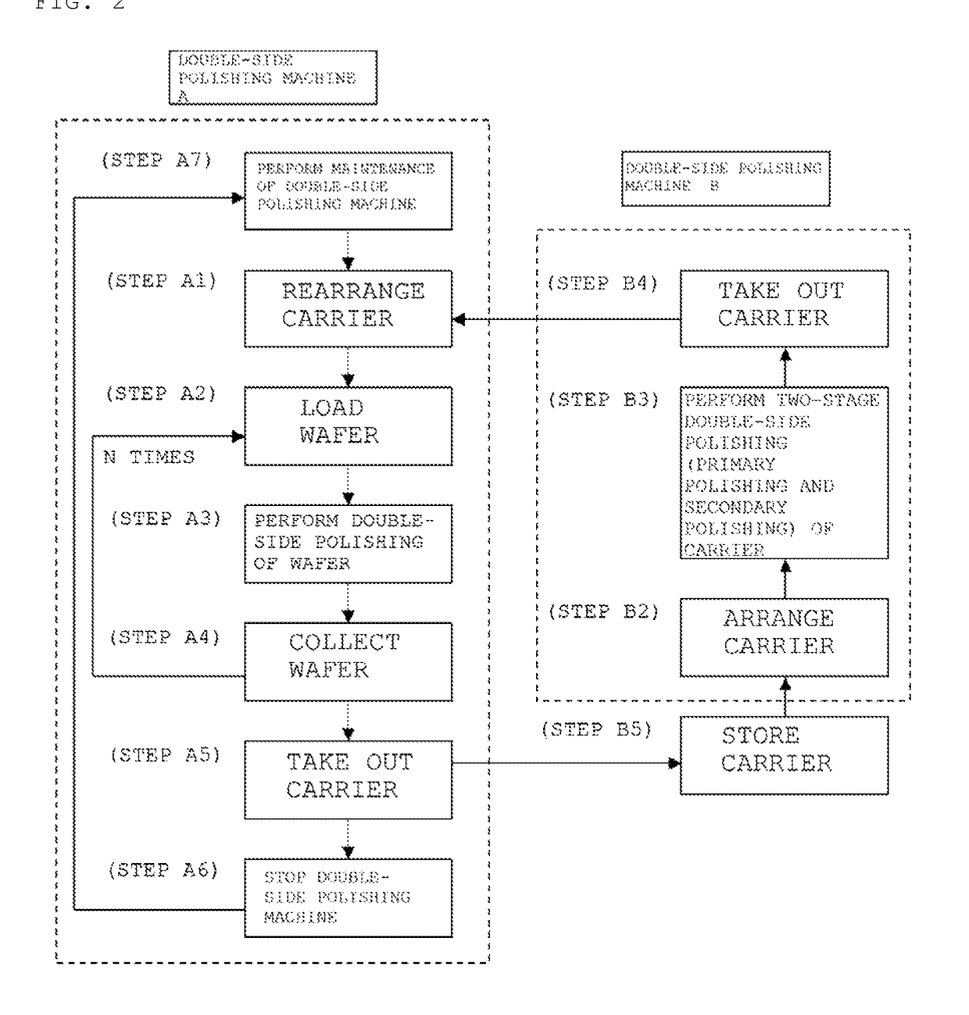
FIG. 2 is a flowchart showing another example of the method for double-side polishing a wafer according to the present invention.

A carrier and wafers were polished with the use of the double-side polishing machines 1 (the double-side polishing machine A and the double-side polishing machine B) shown in FIGS. 3 and 4 in accordance with the method for double-side polishing a wafer shown in FIG. 2.

To replace polishing pads, the carrier used for double-side polishing for wafers was taken out, the double-side polishing machine A was completely stopped, and the polishing pads were replaced. On the other hand, the carrier which had been taken out was temporarily stored, and then two-stage double-side polishing was performed by using the double-side polishing machine B. Subsequently, the carrier was again arranged in the double-side polishing machine A, and each wafer was loaded to be subjected to the double-side polishing and then collected. It is to be noted that the double-side polishing of wafers was performed to 10 batches after rearranging the carrier. One batch includes five wafers.

It is to be noted that conditions of polishing the carrier in the double-side polishing machine B and those of polishing the wafers in the double-side polishing machine A are as follows, respectively.

Polishing of Carrier

The carrier was polished within one hour before polishing the wafers.

As the double-side polishing machine B, DSP-20B manufactured by Fujikoshi Machinery Corporation was used.

As the polishing pads, urethane foam pads having Shore A hardness of 86 were used.

In regard to the carrier, its substrate was made of titanium. As its insert material, FRP provided by immersing glass fibers in epoxy resin was used.

As the slurry, KOH-based slurry which contains silica abrasive grains and has an average grain size of 89 nm, abrasive grain concentration of 13 wt %, and pH 10.5 was used for the primary polishing, and KOH-based slurry which contains no silica abrasive grain and has pH 11.0 and a temperature of 35° C. was used for the secondary polishing.

A machining load was set to 180 gf/cm² in the primary polishing and also set to 70 gf/cm² in the secondary polishing.

A machining time was set in such a manner that a stock removal in the primary polishing becomes 30 nm or more (specifically, 50 nm). It was set to 5 min in the secondary polishing.

As to rotational speeds of respective driving units, an upper turntable was set to −13.4 rpm, a lower turntable was set to 35 rpm, a sun gear was set to 25 rpm, and an internal gear was set to 7 rpm.

Dressing of the polishing pads was performed by rubbing a dress plate having diamond abrasive grains electrodeposited thereon against the upper and lower polishing pads while flowing pure water under a predetermined pressure.

Polishing/Cleaning of Wafers

As each wafer, a P-type silicon single-crystal wafer having a diameter of 300 mm was used.

As the double-side polishing machine A, DSP-20B manufactured by Fujitsu Machinery Corporation was used. This is a double-side polishing machine different from the double-side polishing machine B which was used for polishing the carrier.

As the polishing pads, urethane foam pads having Shore A hardness of 86 were used.

As the carrier, a titanium carrier subjected to the carrier polishing was used.

As the slurry, KOH-based slurry which contains silica abrasive grains and has an average grain size of 35 nm, abrasive grain concentration of 1.0 wt %, and pH 10.5 was used.

A machining load was set to 150 gf/cm².

A machining time was set in such a manner that a wafer thickness becomes equal to that of the carrier.

As to rotational speeds of respective driving units, an upper turntable was set to −13.4 rpm, a lower turntable was set to 35 rpm, a sun gear was set to 25 rpm, and an internal gear was set to 7 rpm.

Dressing of the polishing pads was performed by rubbing a dress plate having diamond abrasive grains electrodeposited thereon against the upper and lower polishing pads while flowing pure water under a predetermined pressure.

As cleaning of wafers, SC-1 cleaning was carried out with $NH_4OH:H_2O_2=1:1:15$.

Comparative Example

Figure 5:
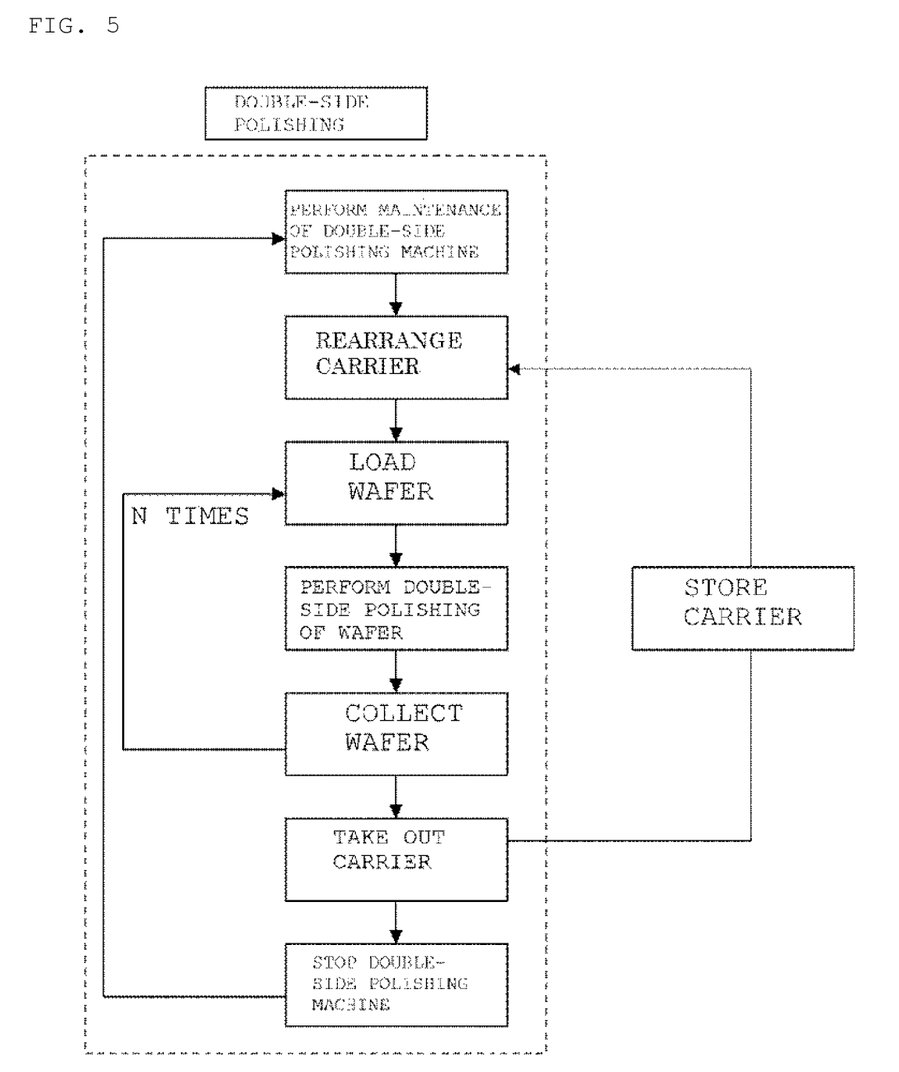
FIG. 5 is a flowchart showing an example of a conventional method for double-side polishing a wafer.

Double-side polishing for wafers was performed with the use of the double-side polishing machine which is the same as the double-side polishing machine shown in FIGS. 3 and 4 in accordance with a conventional method for double-side polishing a wafer shown in FIG. 5. As shown in FIG. 5, in the conventional method, the two-stage double-side polishing using the double-side polishing machine B after storage of a carrier like the present invention was not performed. That is, after the carrier was stored, the titanium carrier was again arranged in the double-side polishing machine without performing the two-stage double-side polishing, and the double-side polishing for wafers was carried out. Other conditions were the same as those in Example.

Surfaces of each of the thus obtained polished wafers (wafers subjected to the double-side polishing after rearranging the carrier) according to Example and Comparative Example were examined after the cleaning. Specifically, measurement was carried out by using 200 nmup of an inspection apparatus SP1 (manufactured by KLA-Tencor), thereby measuring scratches on the wafer surfaces.

Figure 6:
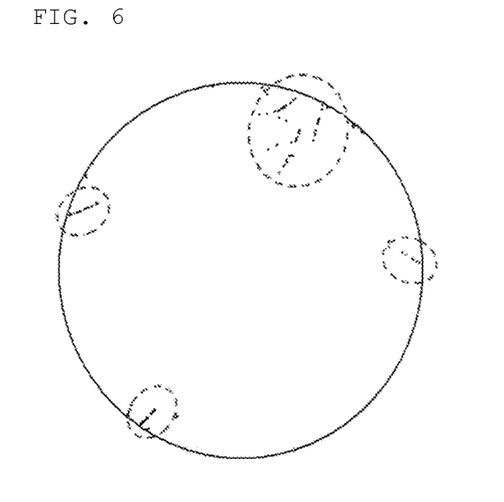
FIG. 6 is an observation view showing an example of scratches in Comparative Example.

FIG. 6 shows an example (Comparative Example) of the scratches. Each part surrounded by a dotted line circle is an example of the scratches.

Figure 7:
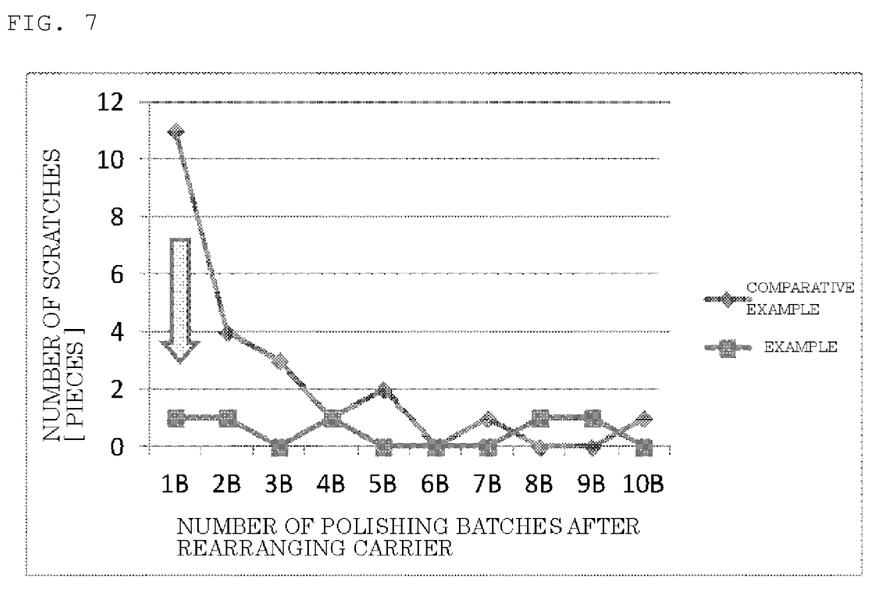
FIG. 7 is a graph showing changes in number of scratches per batch in Example and Comparative Example.

Furthermore, changes in number of the scratches per batch were monitored. FIG. 7 shows changes in number of scratches per batch. It is to be noted that an average value of five wafers in each batch is shown.

As shown in FIG. 7, in Comparative Example of the conventional method where the polishing for the carrier was not performed, the number of scratches is large (11 to 3) in several batches (first to third batches) immediately after rearrangement of the carrier. As a reason for this, it can be considered that a natural oxide film, slurry residues, and others formed on the surfaces of the carrier temporarily used, taken out, and stored were removed from the carrier at the time of double-side polishing for the wafers, and damaged the wafer surfaces.

On the other hand, in Example where the present invention was carried out, it can be understood that the number of scratches was able to be greatly suppressed (1 or 0) in several batches (first to third batches) immediately after rearrangement of the carrier as compared with Comparative Example. As a reason for this, it can be considered that a natural oxide film, slurry residues, and others on the carrier surfaces were able to be appropriately removed by the present invention before rearranging the carrier in the double-side polishing machine A.

Figure 1:
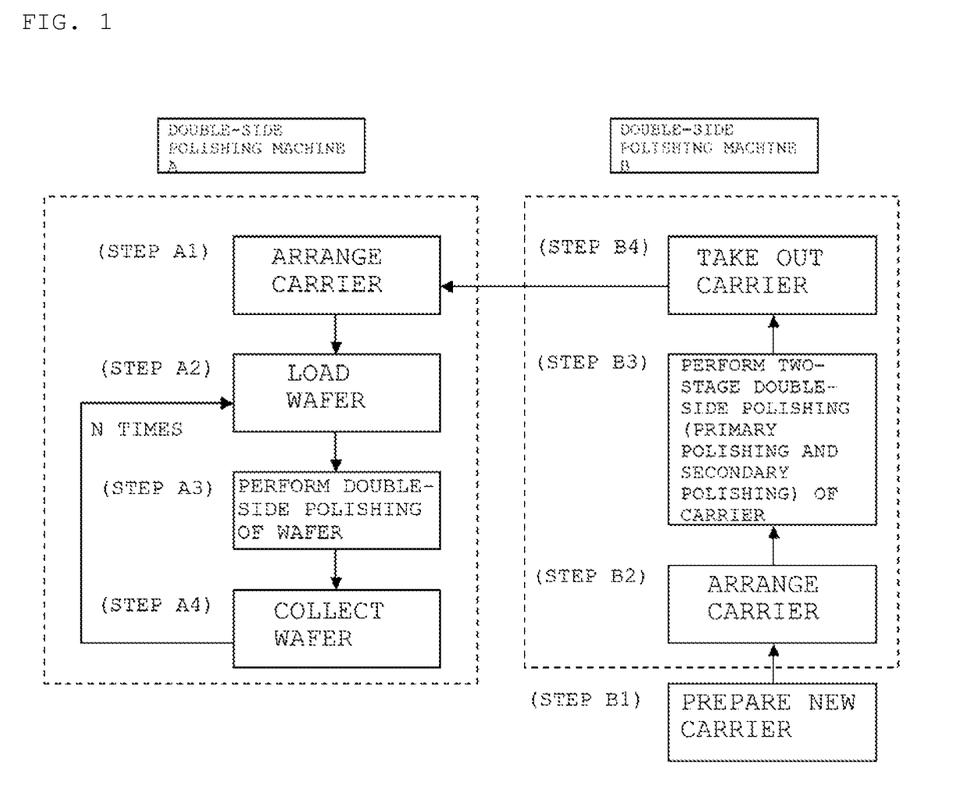
FIG. 1 is a flowchart showing an example of a method for double-side polishing a wafer according to the present invention.

Further, Example is a case where the once used carrier is reused but, when a new carrier was separately prepared, the method for double-side polishing a wafer was carried out based on Embodiment 1 of the present invention shown in FIG. 1, and the number of scratches of polished wafers were checked, the number of scratches was suppressed in several batches immediately after arranging the carrier like Example.

It is to be noted that the present invention is not restricted to the embodiment. The embodiment is an illustrative example, and any example which has substantially the same structure and exerts the same functions and effects as the technical concept described in claims of the present invention is included in the technical scope of the present invention.

The invention claimed is:

1. A method for double-side polishing a wafer, comprising:
    double-side polishing a carrier, using a second double-side polishing machine, without a wafer disposed in the carrier, the double-side polishing of the carrier including two-stage double-side polishing which includes primary polishing using slurry containing abrasive grains and secondary polishing using an inorganic alkali solution containing no abrasive grain;
    after the double-side polishing of the carrier, arranging the carrier between upper and lower turntables having polishing pads attached thereto respectively in a first double-side polishing machine different from the second double-side polishing machine;
    holding the wafer in a holding hole formed in the carrier to be sandwiched between the upper and lower turntables; and
    double-side polishing the wafer using the first double-side polishing machine, wherein a plurality of batches of the double-side polishing the wafer using the first double-side polishing machine are performed, and the double-side polishing including the two-stage double-side polishing using the second double-side polishing machine is performed for each of the plurality of batches.

2. The method for double-side polishing a wafer according to claim 1,
wherein the two-stage double-side polishing using the second double-side polishing machine is carried out before first arrangement for the double-side polishing of the wafer.

3. The method for double-side polishing a wafer according to claim 1,
wherein the carrier used for the double-side polishing of the wafer is taken out from the first double-side polishing machine and temporarily stored, and the two-stage double-side polishing of the carrier using the second double-side polishing machine is performed before rearranging the carrier for the double-side polishing of a next wafer.

4. The method for double-side polishing a wafer according to claim 2,
wherein the carrier used for the double-side polishing of the wafer is taken out from the first double-side polishing machine and temporarily stored, and the two-stage double-side polishing of the carrier using the second double-side polishing machine is performed before rearranging the carrier for the double-side polishing of a next wafer.

5. The method for double-side polishing a wafer according to claim 1,
wherein the carrier is made of a metal.

6. The method for double-side polishing a wafer according to claim 2,
wherein the carrier is made of a metal.

7. The method for double-side polishing a wafer according to claim 3,
wherein the carrier is made of a metal.

8. The method for double-side polishing a wafer according to claim 4,
wherein the carrier is made of a metal.

9. The method for double-side polishing a wafer according to claim 1,
wherein the abrasive grains in the slurry used in the primary polishing of the carrier have a diameter of 70 nm or more.

10. The method for double-side polishing a wafer according to claim 8,
wherein the abrasive grains in the slurry used in the primary polishing of the carrier have a diameter of 70 nm or more.

11. The method for double-side polishing a wafer according to claim 1,
wherein polishing pads used in the two-stage double-side polishing of the carrier are urethane foam pads having Shore A hardness of 80 or more.

12. The method for double-side polishing a wafer according to claim 10,
wherein polishing pads used in the two-stage double-side polishing of the carrier are urethane foam pads having Shore A hardness of 80 or more.

13. The method for double-side polishing a wafer according to claim 1,
wherein a polishing stock removal in the primary polishing of the carrier is set to 30 nm or more on each side.

14. The method for double-side polishing a wafer according to claim 12,
wherein a polishing stock removal in the primary polishing of the carrier is set to 30 nm or more on each side.

15. The method for double-side polishing a wafer according to claim 1,
wherein a temperature of the inorganic alkali solution used in the secondary polishing of the carrier is set to 30° C. or more.

16. The method for double-side polishing a wafer according to claim 14,
wherein a temperature of the inorganic alkali solution used in the secondary polishing of the carrier is set to 30° C. or more.

* * * * *